United States Patent [19]

Quate

[11] Patent Number: 5,633,455
[45] Date of Patent: May 27, 1997

[54] METHOD OF DETECTING PARTICLES OF SEMICONDUCTOR WAFERS

[75] Inventor: Calvin F. Quate, Stanford, Calif.

[73] Assignee: Board Of Trustees Of The Leland Stanford, Jr. University, Stanford, Calif.

[21] Appl. No.: 470,658

[22] Filed: Jun. 5, 1995

Related U.S. Application Data

[63] Continuation of Ser. No. 131,803, Oct. 5, 1993, abandoned.
[51] Int. Cl.⁶ .......................................... H01J 37/00
[52] U.S. Cl. ......................... 73/105; 250/306; 250/307
[58] Field of Search ............................ 73/105; 250/306, 250/307

[56] References Cited

U.S. PATENT DOCUMENTS

| | | | |
|---|---|---|---|
| 4,724,318 | 2/1988 | Binnig | 250/307 |
| 5,047,633 | 9/1991 | Finlan et al. | 250/306 |
| 5,085,070 | 2/1992 | Miller et al. | 73/105 |
| 5,107,112 | 4/1992 | Yanagisawa et al. | 250/307 |
| 5,220,555 | 6/1993 | Yanagisawa et al. | 250/307 |
| 5,227,626 | 7/1993 | Okada et al. | 250/307 |
| 5,260,926 | 11/1993 | Kuroda et al. | 250/306 |
| 5,283,442 | 2/1994 | Martin et al. | 250/306 |
| 5,293,781 | 3/1994 | Kaiser et al. | 250/306 |
| 5,345,815 | 9/1994 | Albrecht et al. | 73/105 |

*Primary Examiner*—Richard Chilcot
*Assistant Examiner*—George M. Dombroske
*Attorney, Agent, or Firm*—Skjerven, Morrill, MacPherson, Franklin & Friel; David E. Steuber

[57] ABSTRACT

A device for detecting the presence of particles and irregularities on the surface of a semiconductor wafer or other substrate includes a plurality of cantilevers formed on a semiconductor substrate and a means of detecting the deflection of each of the cantilevers. The cantilevers may, for example, be formed in rows and separated by selected distances. The entire substrate is then scanned over the surface to be examined, in a raster pattern, for example, and the deflection of the individual cantilevers is monitored.

12 Claims, 9 Drawing Sheets

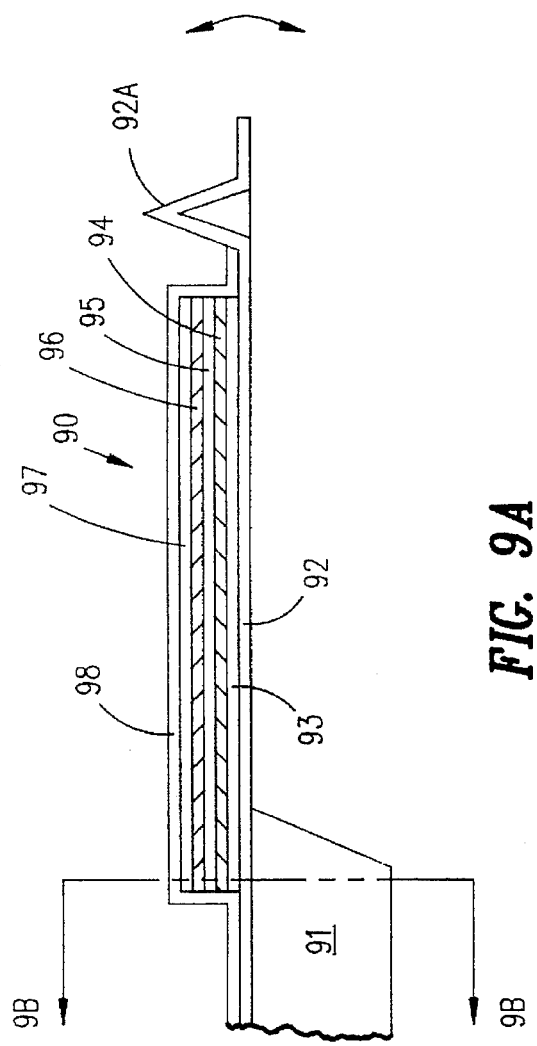
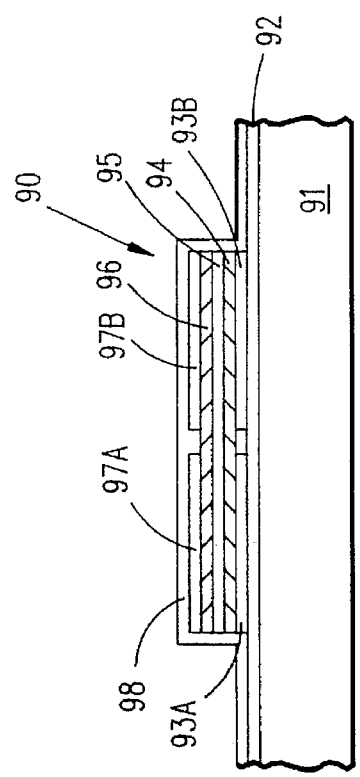
FIG. 9A
FIG. 9B

METHOD OF DETECTING PARTICLES OF SEMICONDUCTOR WAFERS

This application is a continuation of application Ser. No. 08/131,803, filed Oct. 5, 1993 now abandoned.

FIELD OF THE INVENTION

This invention relates to semiconductor chip fabrication processes and, in particular, to a device for detecting the presence of small particles on a semiconductor wafer before processing of the wafer begins.

BACKGROUND OF THE INVENTION

In semiconductor chip fabrication plants the wafers are typically subjected to a preliminary test to check for particles or other defects on their surfaces. If a particle or other defect is detected, the wafer may be cleaned or discarded, as appropriate. At present, the surfaces of the wafers are typically inspected with an optical system. Such optical systems are capable of detecting particles having widths of approximately 500 Å or greater, but they are unable to detect smaller particles.

This limitation has not presented a problem until now, because particles smaller than about 500 Å did not interfere with the fabrication processes. The line widths on microchips are becoming much smaller, however. Line widths of 0.35 μm are now common, and they are moving towards 0.25 μm. Eventually, they will reach 0.1 μm (1,000 Å units). At this scale, a particle having a width of, say, 300 Å would cover about one-third of a line width and could easily result in a defective chip.

In a device according to this invention, particles having dimensions far less than 500 Å can be detected on a semiconductor wafer prior to the commencement of processing.

SUMMARY OF THE INVENTION

In accordance with this invention, a plurality of cantilevers are formed in a substrate consisting of, for example, a semiconductor material. Each of the cantilevers is attached to a substrate at its fixed end and has the tip located near its free end. The cantilevers are positioned within a selected distance of each other.

A means is provided for detecting the deflection of each cantilever as its tip rides over the surface of a semiconductor wafer or other substrate. In the preferred embodiment, the deflection detection means includes a piezoresistor which is embedded within the cantilever. A voltage is applied to the terminals of the piezoresistor, and detection circuitry (e.g., a Wheatstone bridge) detects changes in the resistance of the piezoresistor as the cantilever deflects.

To examine a wafer or other substrate for particles or defects, the cantilevers are brought into contact with its surface and they are scanned across the surface, preferably in a Raster-type pattern. Because a plurality of cantilevers are provided, and all of them are scanned simultaneously, the entire surface of a wafer may be examined within a relatively short period of time. Particles are detected by monitoring the deflection of each cantilever, which is capable of detecting a particle by itself.

In the preferred embodiment, the cantilevers are formed in the individual dice of a wafer which is the same size as the wafer to be examined. Within each die, the cantilevers are formed in a single row. The longitudinal axes of the cantilevers are parallel and are separated by a uniform distance from each other.

BRIEF DESCRIPTION OF THE DRAWINGS

FIG. 9A and 9B illustrate a piezoelectric cantilever.

DESCRIPTION OF THE INVENTION

Figure 1:
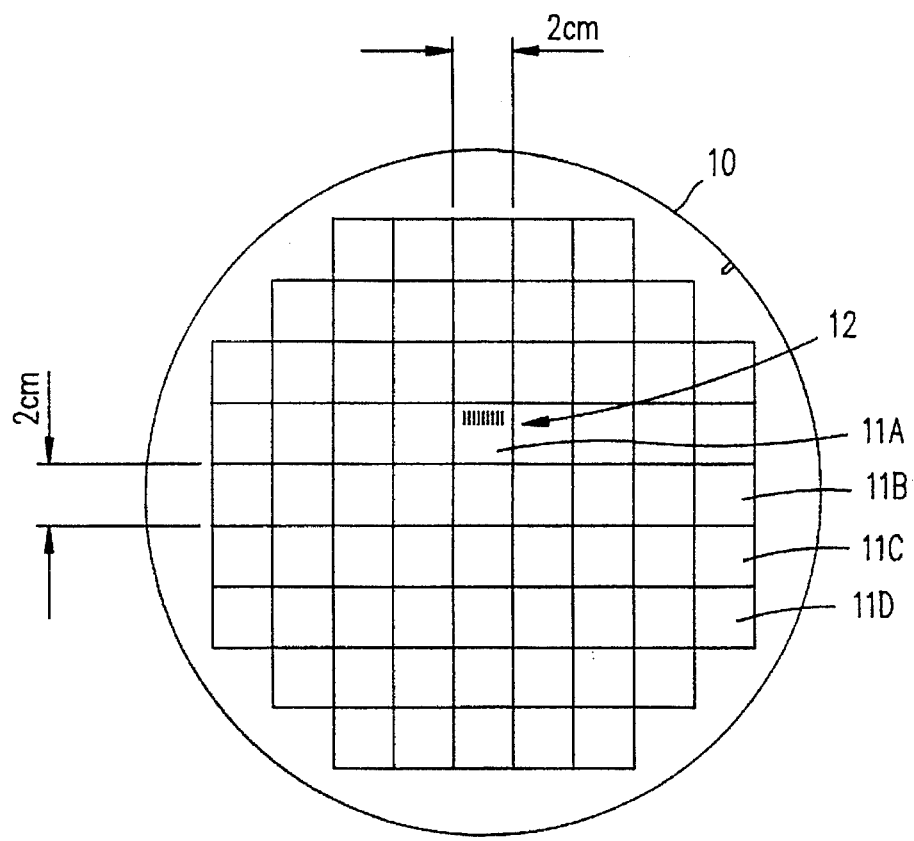
FIG. 1 illustrates a plan view of a semiconductor wafer containing a plurality of cantilevers according to the invention.

FIG. 1 illustrates a plan view of a semiconductor wafer 10 which includes a plurality of dice exemplified by dice 11A, 11B, 11C and 11D. In this embodiment, wafer 10 has a diameter of 200 mm, and each of dice 11A–11D is 2 cm square. Each die, as illustrated on die 11A, includes a row of 100 cantilevers which are too small to be represented individually in FIG. 1 but are designated collectively by the reference numeral 12.

Figure 2:
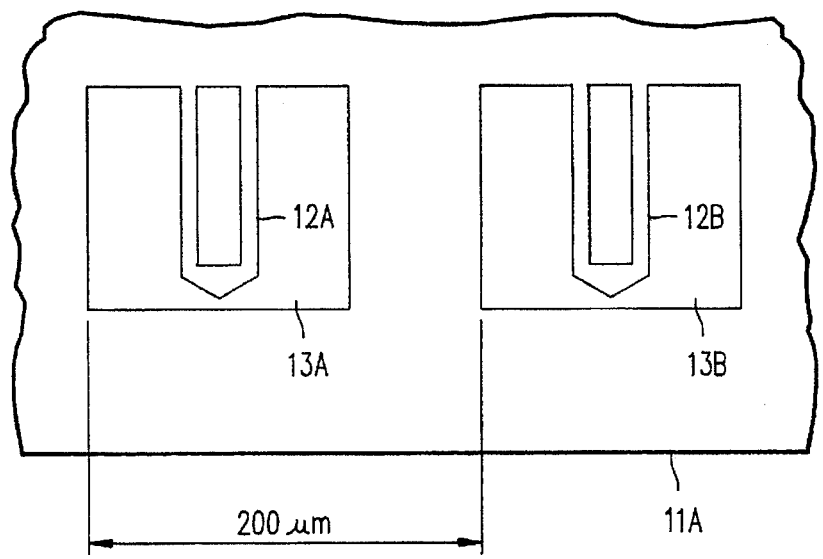
FIG. 2 illustrates a close-up view of two of the cantilevers.

FIG. 2 illustrates a close up view showing two of cantilevers 12, which are designated 12A and 12B. Cantilevers 12A and 12B are formed within windows 13A and 13B in die 11A.

Figure 3A:
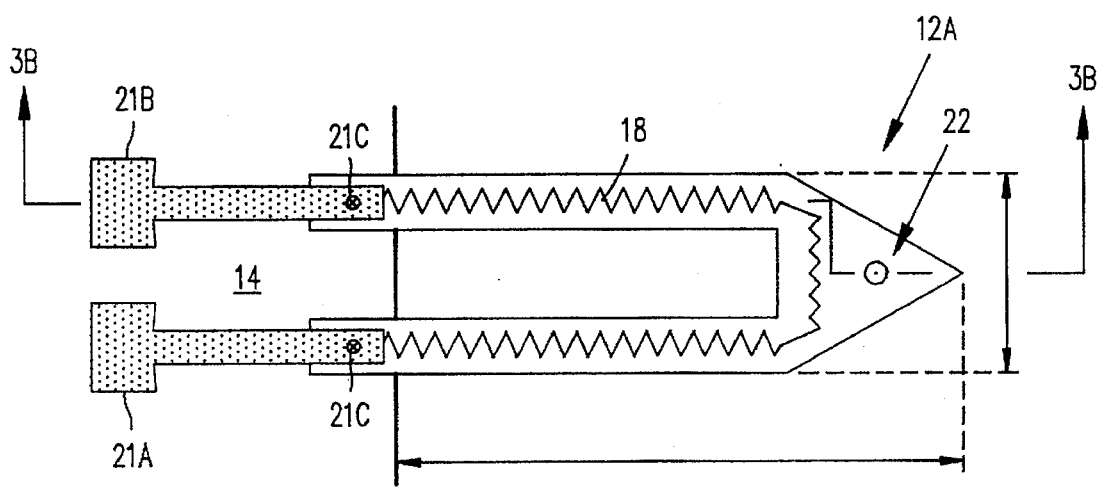
FIGS. 3A and 3B illustrate plan and cross-sectional views, respectively, of a single cantilever.
Figure 3B:
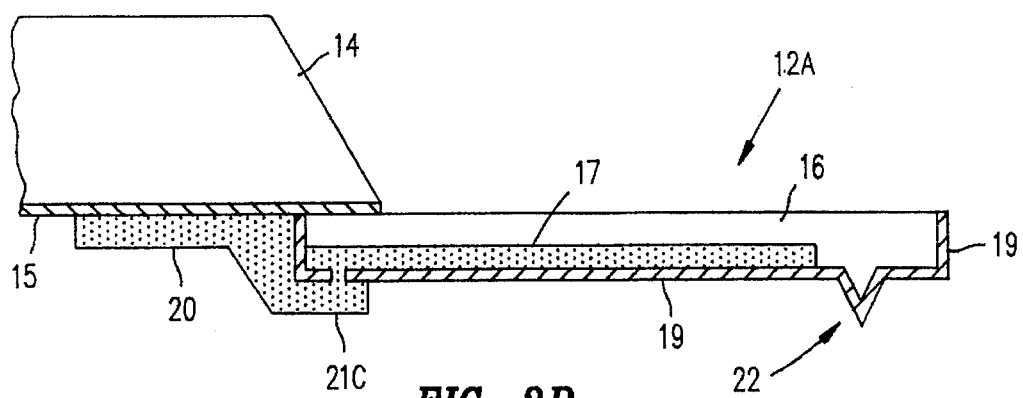

FIGS. 3A and 3B illustrate detailed views of cantilever 12A, FIG. 3A being a bottom plan view and FIG. 3B being a cross-sectional view taken at section 3B—3B in FIG. 3A. In this embodiment, all of cantilevers 12 are identical to cantilever 12A and all are micromachined in silicon. Die 11A includes a silicon substrate 14, which is underlain by a silicon dioxide ($SiO_2$) layer 15. Cantilever 12A includes a layer 16 of intrinsic silicon as well as a layer 17, which consists of silicon doped with arsenic or boron to form a photoresistor 18. (The thicknesses of layer 17 and the other layers shown in the drawing are exaggerated for clarity.) A $SiO_2$ layer 19 is formed on the bottom and side surfaces of cantilever 12A to serve as a buffer. A metal layer 20 includes terminals 21A and 21B which make contact with piezoresistor 18 through apertures 21C in $SiO_2$ layer 19. In this embodiment, $SiO_2$ layer 19 is approximately 5,000 Å thick, but it may have a thickness in the range of 2,750–8,000 Å. A conical tip 22 protrudes downward near the free end of cantilever 12A.

To detect the deflection of cantilever 12A, a voltage difference is applied to terminals 21A and 21B, and variations in the resistance of piezoresistor 18 are detected. The detection circuitry may advantageously include a Wheatstone bridge and may be associated with a feedback control system of the kind described in application Ser. No. 08/072, 286, filed Jun. 3, 1993, now U.S. Pat. No. 5,354,985, issued Oct. 11, 1994, which is incorporated herein by reference.

Figure 4A:
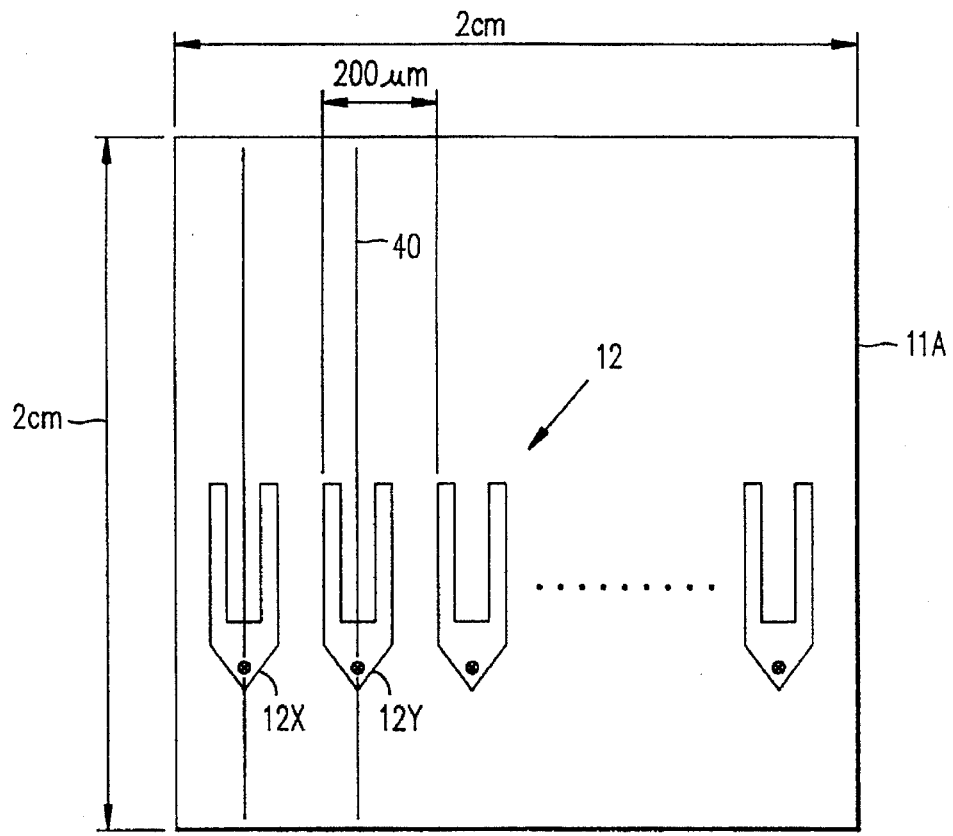
FIG. 4A illustrates a conceptual view of a single die on the semiconductor wafer.

FIG. 4A illustrates a conceptual view of die 11A with cantilevers 12 lined up in a row across the width of die 11A.

As an example, assume that die 11A is 2 cm square, and that there are 100 cantilevers 12 lined up in a row across the width of die 11A. Accordingly, cantilevers 12 are separated from each other by a distance of about 200 μm.

Figure 5:
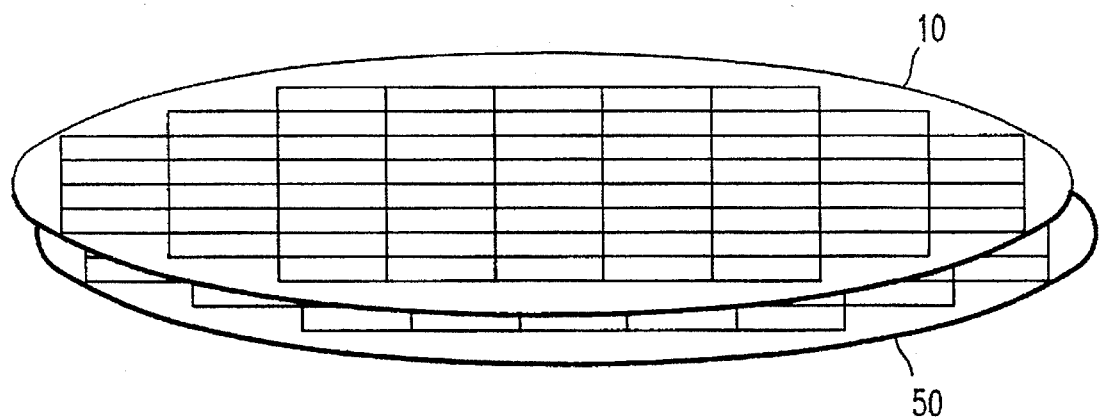
FIG. 5 illustrates the juxtaposition of a detection device according to this invention and a semiconductor wafer to be examined.

FIG. 5 illustrates conceptually how wafer 10 is aligned over a semiconductor wafer 50 which is to be tested for particles and other defects. As wafer 10 is moved or "scanned" over wafer 50, each of the cantilevers 12 is monitored to detect a flexure which would be indicative of a particle or other defect. Preferably, wafer 10 is scanned in a raster-type pattern with respect to wafer 50, preferably by mounting wafer 10 on a piezoelectric tube scanner of the kind well known in the field of atomic force microscopy.

Figure 4B:
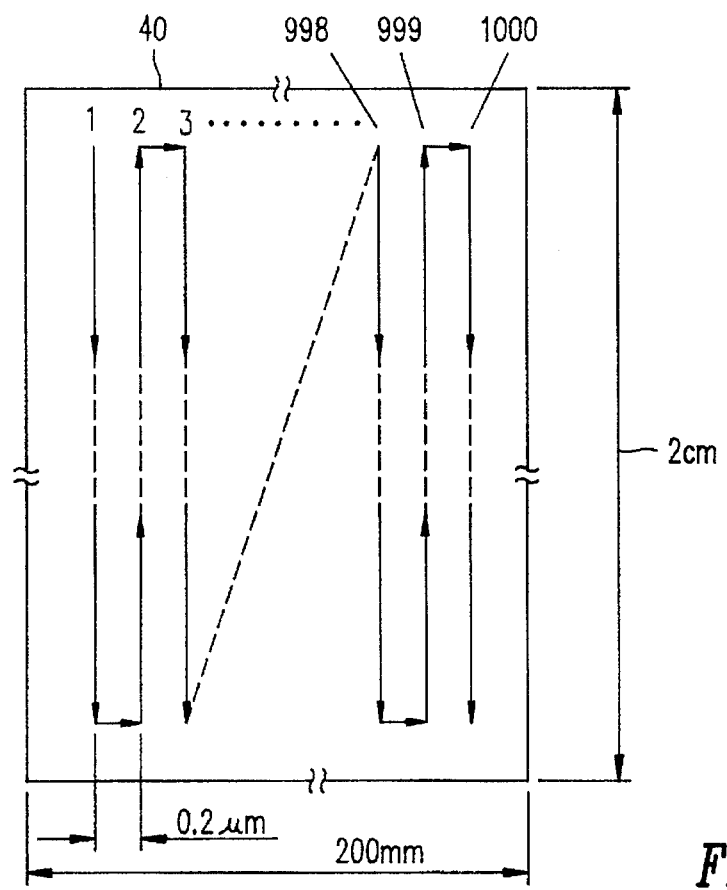
FIG. 4B illustrates a possible scanning pattern of a single cantilever.

FIG. 4B is an expanded view of a section 40 of die 11A (see FIG. 4A) and illustrates a possible scanning pattern. Since cantilevers 12 are separated by 200 μm, section 40 has a width of 200 μm and a length of 2 cm. Each of cantilevers 12 is caused to scan in a raster pattern which is defined by 1,000 parallel lines separated by a distance of 0.2 μm. If, for example, cantilever 12X shown in FIG. 4A scans the area of section 40, cantilever 12Y would simultaneously scan an adjacent 200 μm×2 cm section of die 11A. Similarly, each of cantilevers 12 scans a similar area, with the result that a 2 cm area of wafer 50 is examined. Since each of dice 11 contains a similar row of cantilevers, the entire surface of wafer 50 can be examined in this manner.

The output signals from the detection circuitry for each of cantilevers 12 is delivered to a computer, which is programmed to monitor the output signals simultaneously and to provide an indication whenever one of cantilevers 12 encounters a particle or irregularity on the surface being examined.

FIGS. 6A–6L illustrate a process for manufacturing one of cantilevers 12. The starting material is a <100> type silicon-on-insulator (SOI) wafer, as shown in the cross-sectional view of FIG. 6A, in which 400 represents a bottom silicon layer, 401 represents a $SiO_2$ layer and 402 represents a top silicon layer. The SOI wafer may be formed by oxidizing two wafers, bonding them together, and lapping one of the two wafers to the desired thickness of layer 402. Alternatively, oxygen may be implanted in a silicon wafer and annealed so as to form a buried oxide layer. An intrinsic silicon layer is then grown epitaxially to the desired thickness. In one embodiment, $SiO_2$ layer 401 is 4000 Å thick and the top silicon layer 402 is 10 μm thick.

Figure 6A:
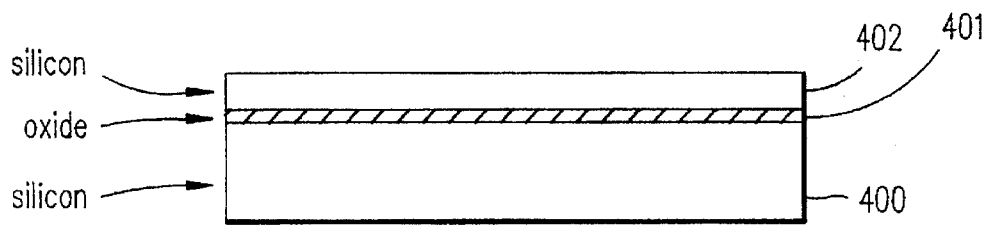
FIGS. 6A–6L illustrate a process for fabricating a piezoresistive cantilever for the device of this invention.
Figure 6B:
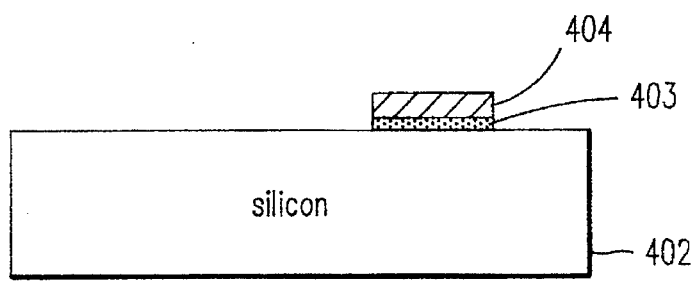
Figure 6C:
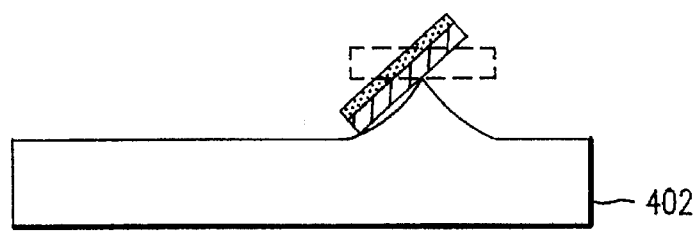
Figure 6D:

FIGS. 6B–6D illustrate the fabrication of tip 22 in top silicon layer 402. As shown in FIG. 6B, a masking material consisting of an oxide layer 403 and a photoresist layer 404 is patterned into a circle on the top surface of layer 402. The masking material may alternatively contain a nitride, a refractory metal or any other material that is not etched by the silicon etchant. The thickness of the masking material depends on the desired height of the tip and the etch selectivity between the masking material and the silicon substrate. An oxide layer 2000 Å thick is sufficient to make tips 10 μm in height and a 1000 Å layer of evaporated aluminum may be used to make tips 100 μm in height.

Next, as shown in FIG. 6C, silicon layer 402 is etched in either a plasma or wet etchant. Although most of the etching occurs in the vertical direction, there is some finite undercutting of the mask. By carefully monitoring the etching process through periodic optical inspections, the etching can be stopped just prior to or just after the masking material caps have fallen off. These two possibilities are illustrated in FIG. 4C. In practice, the caps usually fall off and come to rest against the tip. The cap is then selectively removed and conical tip 22 is exposed, as shown in FIG. 6D.

A possible problem with the foregoing process is that the etching conditions and durations are critical for the proper formation of the conical member. Since etching rates and durations are two of the least controllable fabrication parameters, a fabrication process that relies heavily on them is usually very difficult to reproduce from wafer to wafer or even across a single wafer. Plasma etching is very non-uniform so that the tips in the center may take longer to form than the tips at the perimeter of the wafer. If wet etching is used, the etch time becomes more critical since the caps are washed away in the etchant and the tips are quickly attacked. It has been found that after the initial fabrication process the apexes of the conical tips typically have radii of curvature of approximately 500 Å.

Figure 6E:
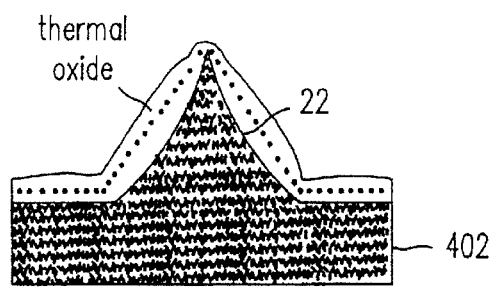
Figure 6F:
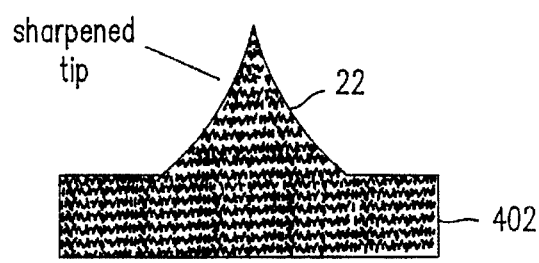

In order to make the tips sharper and at the same time increase their uniformity, they can be sharpened using a low temperature thermal oxidation process, as illustrated in FIGS. 6E and 6F. FIG. 6E shows conical member 22 after it has been thermally oxidized at 950° C. to form an oxide layer 2000 Å to 1 μm in thickness. When the oxide is selectively removed in an HF acid solution, tip 22 is sharper and has a higher aspect ratio than it had prior to oxidation. The resulting form of tip 22 is shown in FIG. 6F. This process may be repeated several times to attain the required degree of sharpness. The mechanism of oxidation that led to the sharpening process is described in detail in R. B. Marcus and T. T. Sheng, "The Oxidation of Shaped Silicon Surfaces", J. Electrochem. Soc., Vol. 129, No. 6, pp. 1278–1282, June 1982, which is incorporated herein by reference.

Figure 6G:
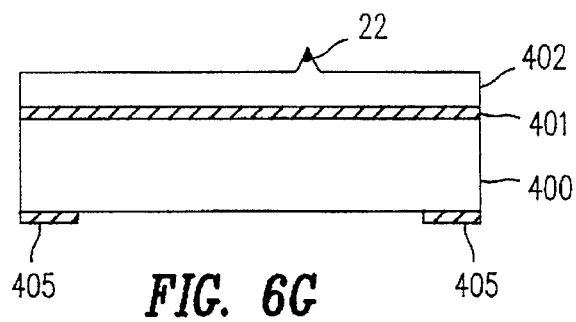

FIG. 6G shows the sharpened conical tip 22 protruding from the remains of top silicon layer 402. Masking layer 405 is an oxide-photoresist layer which is formed at the same time as layers 403 and 404 are formed on the top of silicon layer 402 (FIG. 4B). The masking layers on the top and bottom of the substrate are aligned with each other.

Figure 6H:
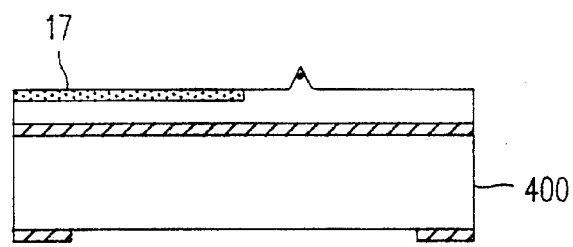

After tip 22 is formed, boron is implanted in layer 402 at a dose of $5 \times 10^{14}$ $cm^{-2}$ and an energy of 80 keV to form layer 17 (piezoresistor 18). This results in a sheet resistance of 270 Ω. Piezoresistor 18 is formed in a U-shape by masking the top surface of the substrate by a known photolithographic technique. A metal mask may be used. The results of this process are illustrated in FIG. 6H.

Figure 6I:
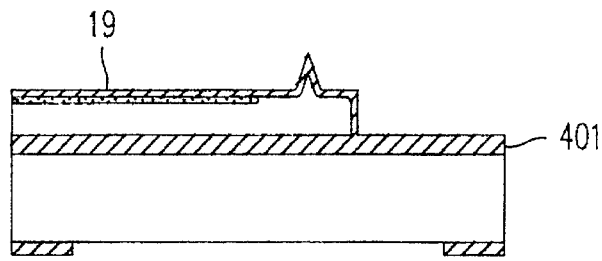
Figure 6J:
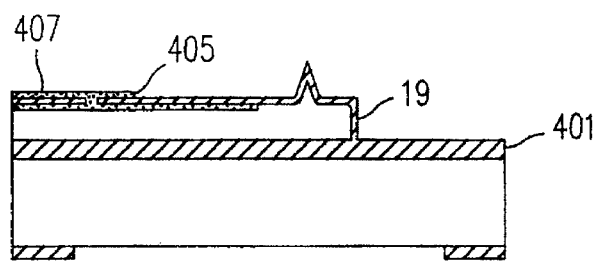

Next, an oxide layer is formed to protect the silicon from subsequent processing. A layer 300 Å thick may be formed by wet oxidation at 900° C. for 10 minutes. A layer of photoresist is applied, and the shape of the cantilever is defined by standard photolithography techniques. During this and subsequent photolithography steps a thick photoresist layer is used to protect the tip. The silicon is then etched in a plasma etcher until oxide layer 401 stops the etch. After the photoresist is stripped, the oxide layer is removed and a new, thicker (e.g. 5000 Å) thermal oxide layer 19 is grown. The result is illustrated in FIG. 6I. This last oxidation step causes the boron to diffuse into the cantilever. Alternatively, the boron implantation could be done after the oxidation.

Another photolithography step is used to open contact holes 406 in the oxide layer 19. An aluminum layer 407 (containing 1% silicon) is sputtered, with the results shown in FIG. 6J. In one embodiment, layer 407 is 1 μm thick. Aluminum layer 407 is patterned into metal lines by a photolithography process. A forming gas anneal at 400° C. for 45 minutes anneals the contacts.

Figure 6K:
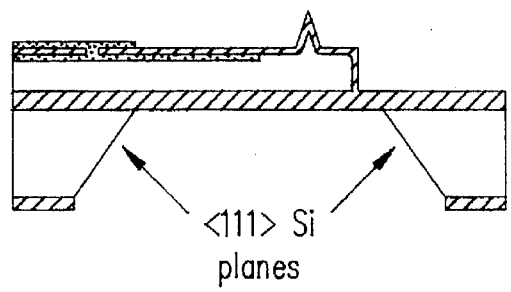
Figure 6L:
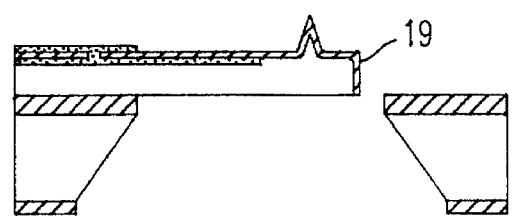

Finally, as illustrated in FIG. 6K, the silicon is etched from the back of the substrate to free and form a window around the cantilever similar to windows 13A and 13B (FIG. 2). This etch is performed with an ethylenediamine/pyrocatechol (EDP)/water solution. However, since the EDP solution attacks aluminum, the top of the cantilever is protected with a thick layer 408 of polyimide. A layer at least 10 µm thick is needed to insure that the cantilever and the tip are completely protected. EDP etches silicon preferentially along the <100> crystallographic plane but not the <111> plane. Therefore the etch defines a precise rectangular opening on the bottom, which is defined by four <110> lines. The EDP will stop etching when it reaches the bottom of oxide layer 401. Oxide layer 401 is then removed in a buffered oxide etch solution, and polyimide layer 408 is stripped in an oxygen plasma. The freed cantilever is illustrated in FIG. 6L.

Figure 7:
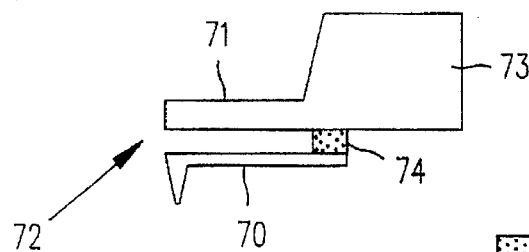
FIG. 7 illustrates a cantilever with a capacitive counter electrode.

Alternatively, the cantilever can be fabricated in the capacitive structure illustrated in FIG. 7, where a cantilever 70 is separated from a counter electrode 71 by an air gap 72. Air gap 72 may be about 1.5 µm wide. Cantilever 70 is attached to a wafer 73 via a $SiO_2$ layer 74. Counter electrode 71 projects from wafer 73, and both cantilever 70 and counter electrode 71 are single-crystal silicon beams. The capacitance between cantilever 70 and counter electrode 71 is typically about 0.3 pF, and it varies as cantilever 70 deflects. It is known to detect the variation in the capacitance and use this measurement to adjust the neutral position of cantilever 70.

The neutral position for each cantilever in an array of cantilevers as shown in FIG. 1 may be determined by applying a high-frequency signal to each of the counterelectrodes, and detecting the mechanical resonant frequency of each cantilever by means of the piezoresistor. The cantilevers are positioned near to the surface to be examined such that their tips are separated from the surface by approximately 10–200 Å. Since the mechanical resonant frequency of each cantilever will vary depending on the actual distance of its tip from the surface (because of the gradient of the van der Waals forces between the tip and surface), the vibrational frequencies of the cantilevers can be detected and this information will be indicative of the distance between the respective tips and the surface. An appropriate DC voltage is then applied to each counterelectrode to adjust the spacing between the corresponding cantilever and the surface. Preferably, since the cantilevers typically have slightly different resonant frequencies, a base level resonant frequency for each cantilever is determined initially by vibrating it at a position removed from the substrate.

Figure 8A:
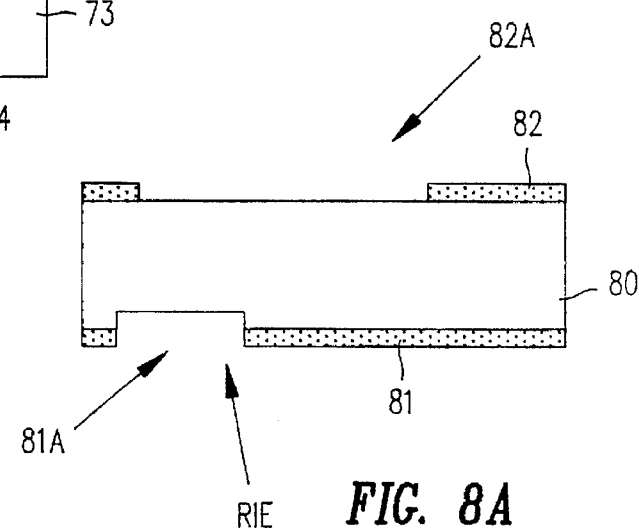
FIGS. 8A–8F illustrate steps in the fabrication of the capacitive cantilever shown in FIG. 7.
Figure 8B:
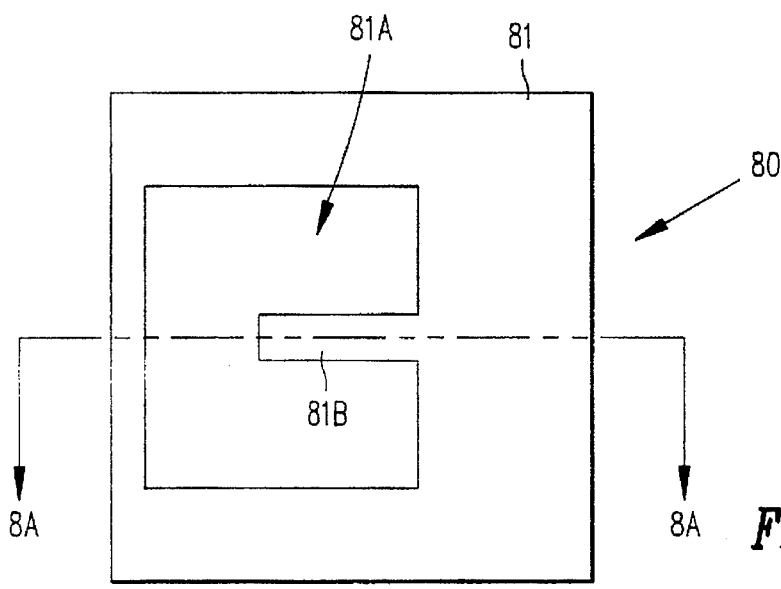

The steps required to form counter electrode 71 are illustrated in FIGS. 8A–8F. The starting point is a silicon wafer 80, shown in FIG. 8A, the sides of which are patterned with $SiO_2$ layers 81 and 82. An opening 81A in $SiO_2$ layer 81 is reactive ion etched to a depth of about 20 µm, and a window 82A is formed in layer 82. FIG. 8B, which is a view of wafer 80 from below, shows the actual shape of opening 81A and the cross section 8A—8A at which FIG. 8A is taken. A protrusion 81B marks the area where the counter electrode will be formed.

Figure 8C:
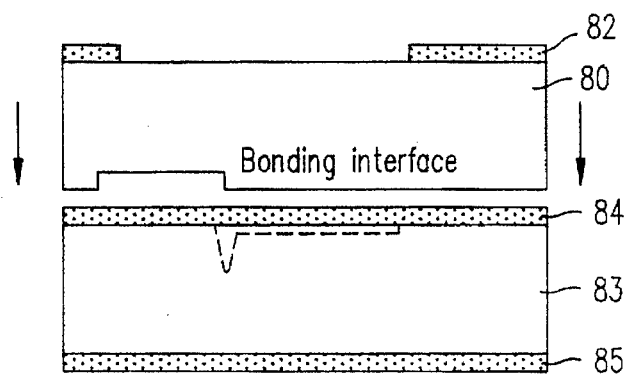

After opening 81A is formed, $SiO_2$ layer 81 is removed, and a second wafer 83, whose surfaces are covered by $SiO_2$ layers 84 and 85, respectively, is silicon-fusion-bonded to the bottom surface of wafer 80. Before bonding, wafers 80 and 83 are cleaned, and their surfaces are hydrolyzed before bringing them into contact. The silicon-fusion-bonding may be performed in an oxidation furnace for four hours at about 1100° C. This part of the process is illustrated in FIG. 8C. Any undesirable $SiO_2$ formed in window 82A on the top of wafer 80 during this step may be removed by re-masking and buffered HF etching this side. At the same time, $SiO_2$ layer 85 is etched.

Figure 8D:
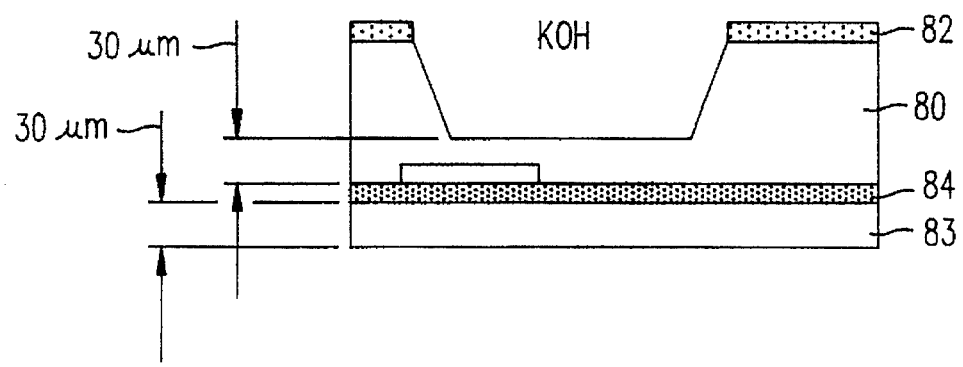

Next, wafers 80 and 83 are subjected to time-controlled KOH etching until a membrane about 30 µm thick remains on either side of $SiO_2$ layer 84. The resulting structure is illustrated in FIG. 8D. Since FIG. 8D is a cross-sectional view, it is apparent that the depression formed by the KOH etch is in the form of a truncated, four-sided pyramid.

Figure 8E:
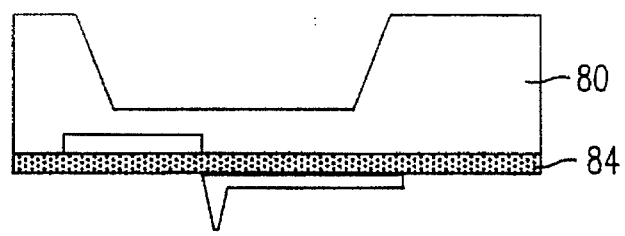

The steps illustrated in FIGS. 6B–6J are then performed on the bottom of wafer 83, thereby forming a cantilever and tip and an embedded piezoresistor and yielding the structure illustrated in FIG. 8E.

Figure 8F:
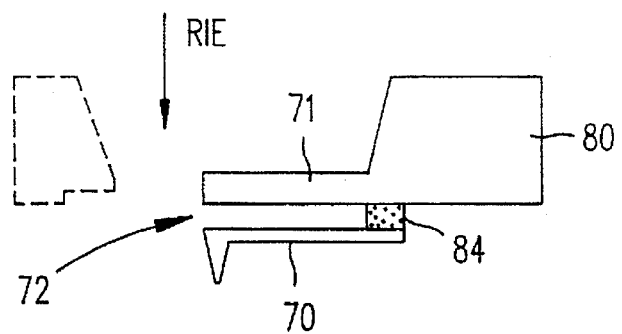

Reactive ion etching is then performed on the top of wafer 80 to form counter electrode 71. Finally, extended buffered HF etching of $SiO_2$ layer 84 forms the gap 72 between cantilever 70 and counter electrode 71, as shown in FIG. 8F. The resulting structure is the same as that shown in FIG. 7.

The capacitive cantilever structure illustrated in FIG. 7 may also be used to detect the deflection of cantilever 70. In this embodiment, the piezoresistor 18 may be omitted, since the deflection detection circuitry derives its signal from the capacitance between cantilever 70 and counter electrode 71.

The capacitive cantilever structure is described in articles entitled "Micromachined atomic force microprobe with integrated capacitive read-out", J. Brugger et al., MME '92-Third European Workshop on Micromachining, Micromechanics and Microsystems, J. Micromech. Microeng., Vol. 2, No. 3, September 1992, p. 218, and "Capacitive AFM microlever with combined integrated sensor/actuator functions", J. Brugger et al., Digest of Technical Papers-Transducers '93, p. 1044, Jun. 7–10, 1993, Pacifico Yokahoma, Japan, pub. Institute of Electrical Engineers of Japan, both of which are incorporated herein by reference.

In another alternative embodiment, the cantilever includes a piezoelectric element sandwiched between electrodes. This type of piezoelectric structure is described generally in articles entitled "Microfabrication of Integrated Scanning Tunneling Microscope", T. R. Albrecht et al., J. Vac. Sci. Techno. A 8(1), January/February 1990, pp. 317–318, and "Piezoelectric Force Sensor For Scanning Force Microscopy", T. Itoh et al., The 7th International Conference on Solid-State Sensors and Actuators, Digest of Technical Papers, June 7–10, 1993, pp. 610–613, both of which are incorporated herein by reference.

This structure is illustrated in cross section in FIGS. 9A and 9B. FIG. 9B is taken at the cross section labeled 9B—9B in FIG. 9A. Cantilever 90 projects from a base (substrate) 91 and contains essentially seven layers. The basic structural support for cantilever 90 is a $SiO_2$ layer 92, from which a tip 92A projects. Overlying $SiO_2$ layer 92 is a bottom electrode 93, which is split into two halves designated 93A and 93B (FIG. 9B). Directly above bottom electrode 93 is a piezoelectric layer 94, consisting of a ZnO film. Next come a middle electrode 95, a piezoelectric layer 96, and a top electrode 97, which is split into halves designated 97A and 97B. Finally, a passivation $SiO_2$ layer 98 overlies the entire structure, except for tip 93.

By techniques well known in the art, electrical contacts are attached to bottom electrode halves 93A and 93B, middle electrode 95, and top electrode halves 97A and 97B. By applying selected voltages to the electrodes, piezoelectric layers 94 and 96 are caused to expand or contract, thereby causing cantilever 90 to bend upwards or downwards. For example, if piezoelectric layer 94 is caused to expand, and piezoelectric layer 96 is caused to contract, cantilever 90 will bend upwards.

Conversely, a bending movement in cantilever 90 will also cause a voltage to appear across the electrodes. For example, one pair of electrodes (say electrodes 93A and 97A) may be used to cause cantilever 90 to vibrate, if the device is operated in the non-contact or tapping modes (described below). The other pair of electrodes may be used simultaneously to detect the flexure of cantilever 90. The electrodes may also be used, in the manner described above in connection with the capacitive embodiment, to adjust the neutral position of cantilever 90, with one pair causing the cantilever to vibrate and the other pair detecting its mechanical resonant frequency.

In the fabrication of cantilever 90, tip 92A is formed in silicon substrate 91 in the manner described above in connection with FIGS. 6B–6D. Tip 92A may be oxide-sharpened as illustrated in FIGS. 6E and 6F. Next, thermal $SiO_2$ layer 92 is grown on the top surface of substrate 91. After $SiO_2$ layer 92 is grown, a Au/Cr alloy is deposited by evaporation to form bottom electrode 93. Electrode halves 93A and 93B are formed by conventional photolithographic patterning and etching. Next, a ZnO film is deposited by Rf sputtering of ZnO in a 100%-$O_2$ plasma in a strong magnetron sputtering system. In a similar manner, Au/Cr is deposited by evaporation to form middle electrode 95 and top electrode 97, and ZnO is sputter deposited to form top piezoelectric layer 96. Using conventional photolithographic techniques, each of these electrodes and piezoelectric layers is etched after it has been deposited, so as to form it in the desired shape. Finally, passivation layer 98 is deposited over the structure and wafer 91 is KOH-etched to form the cantilever.

A cantilever array according to this invention can be used in the contact mode, the non-contact mode, or the "jumping" or "tapping" mode. In the contact mode, which is described in U.S. Pat. No. 4,724,318 to Binnig, the cantilever tip is scanned across the surface of the sample and responds to the repulsive interatomic force, which causes the cantilever to deflect as is passes over topographical features of the sample surface. The deflection of the cantilever is sensed, and is used in a feedback control system to vary the spacing between the cantilever and the sample surface. Thus the force between the cantilever tip and the sample remains essentially constant, and the feedback signal is used as an output which represents the topography of the surface.

In the non-contact mode, which is described in an article by T. Albrecht et al., Journal of Applied Physics, Vol. 69, p. 668 (1991), the tip is held 5–500 Å above the sample and is vibrated at a frequency approximately equal to the resonant frequency of the cantilever. Since the tip is in the region of the attractive van der Waals force between atoms on the surface of the tip and atoms on the surface of the sample, the gradient of the van der Waals force causes the vibration frequency of the cantilever to vary as the tip encounters features of the sample surface. The cantilever is normally vibrated by means of a piezoelectric element which is attached to the carrier wafer or other base. The non-contact mode has the advantage that the tip never makes contact with the sample and therefore cannot disturb or destroy the sample. This is particularly important in biological applications.

In the non-contact mode of operation, the amplitude of vibration of the cantilever must be kept small (e.g. 1–10 Å) to ensure that the tip does not make contact with the sample surface. In the "tapping" or "jumping" mode, which is described in U.S. Pat. No. 5,229,606 to Elings, the amplitude of vibration is increased to the point where the tip touches the sample surface during each cycle of vibration. The cantilever must be relatively stiff to overcome the stickiness associated with the fluid layer which is present on most samples. The amplitude is measured as an RMS value of the deflection detector signal. The change in the amplitude of vibration as the tip strikes the surface can be measured as a decreased RMS value.

The neutral position of each cantilever in an array according to this invention should be adjustable, since a sample which is centimeters or inches in diameter will normally have large scale undulations which do not conform to the contours of the wafer or substrate used in the detection device. In the embodiments described above, the counter electrode, in the capacitive structure, and the piezoelectric material, in the latter embodiment, may be used to adjust the neutral position of the cantilevers. Alternatively, the capacitive and piezoelectric structures may be used as deflection detectors, and this may be done whether the device is operated in the contact, non-contact, or tapping mode.

While several particular embodiments according to this invention have been described, it will be apparent that numerous alternative embodiments may be constructed in accordance with the broad principles of this invention. For example, the cantilevers may be arranged in some preselected pattern other than a row or line. Also, the device of this invention may be used to detect particles and irregularities on a wide variety of flat substrates other than semiconductor wafers, including magnetic disks and flat panel displays. Either the cantilevers or the substrate to be tested may be scanned. Other techniques may be used to detect the deflection of the cantilevers, including the laser beam system described in an article by N. M. Amer et al., App. Phys. Lett., Vol. 53, p. 1054 (1988). While in the described embodiments the cantilevers were formed in a silicon wafer, it will be apparent to those skilled in the art that other materials such as zinc oxide or silicon nitrate may also be used as a substrate for the cantilevers. All such alternative embodiments are intended to be included within the scope of this invention.

I claim:

1. A method of testing a semiconductor wafer or other flat body for the presence of loose particles, said method including the steps of:

(a) providing a substrate, said substrate including a plurality of cantilevers arranged in a selected pattern, each of said cantilevers having a tip located near a free end;

(b) providing a semiconductor wafer or other flat body;

(c) bringing said substrate and said wafer or other flat body into a juxtaposed relationship such that the tips of the cantilevers are near or in contact with a surface of the wafer or other flat body;

(d) causing relative motion between said substrate and said wafer or other flat body, said relative motion being in two dimensions and in a plane parallel to the surface of the wafer or other flat body such that individual tips of said cantilevers scan the surface of said wafer or other flat body in two dimensions;

(e) detecting the deflection of individual ones of said cantilevers; and (f) using the deflection of individual ones of said cantilevers to identify the presence of loose particles on the surface of said wafer or other flat body.

2. The method of claim 1 wherein the tips of said cantilevers are held in contact with the surface of said wafer or other flat body.

3. The method of claim 1 wherein the tips of said cantilevers are held at a distance of from 5 Å to 500 Å from the surface of the wafer or other flat body, said method comprising causing said cantilevers to vibrate and detecting the mechanical resonant frequency of individual ones of said cantilevers.

4. The method of claim 1 wherein said substrate comprises a plurality of piezoresistors, each of said cantilevers including one of said piezoresistors, said method comprising applying a voltage across each of said piezoresistors and detecting changes in the resistance of each of said piezoresistors.

5. The method of claim 4 wherein said substrate comprises a plurality of counter electrodes, each of said cantilevers being disposed adjacent one of counter electrodes, said method comprising applying a voltage to each of said counterelectrodes so as to adjust the neutral position of the cantilever adjacent thereto.

6. The method of claim 1 wherein said substrate comprises a plurality of piezoelectric elements, each of said cantilevers comprising one of said piezoelectric elements disposed between two electrical terminals, said method comprising detecting an output voltage across each of said piezoelectric elements, said output voltage being representative of the bending of said cantilever.

7. The method of claim 6 wherein each of said piezoelectric elements is disposed between a first pair of electrodes and a second pair of electrodes, said method comprising applying a high frequency signal across said first pair of electrodes and detecting an output voltage representative of the degree of bending of said cantilever at said second pair of electrodes.

8. The method of claim 1 comprising the further step of adjusting the neutral positions of the cantilevers to move each of the tips to a selected distance from the surface of the wafer or other flat body.

9. The method of claim 1 wherein said other flat body comprises a magnetic disk.

10. The method of claim 1 wherein said other flat body comprises a flat panel display.

11. The method of claim 1 wherein each of said tips scans a continuous region of said surface and wherein adjacent ones of the continuous regions are contiguous such that together the tips scan a continuous area of the surface made up of the continuous regions.

12. The method of claim 11 wherein the substrate is caused to scan the surface of said wafer or other flat body in a raster pattern such that each of the continuous region is rectangular.

* * * * *